(12) United States Patent
Duduman et al.

(10) Patent No.: US 10,511,303 B2
(45) Date of Patent: Dec. 17, 2019

(54) GATE DRIVER FOR DEPLETION-MODE TRANSISTORS

(71) Applicant: Sarda Technologies, Inc., Durham, NC (US)

(72) Inventors: Bogdan M. Duduman, Raleigh, NC (US); Anthony G. P. Marini, Clinton, MA (US); William R. Richards, Jr., Cary, NC (US); William E. Batchelor, Raleigh, NC (US); Greg J. Miller, Cary, NC (US); John K. Fogg, Cary, NC (US)

(73) Assignee: Sarda Technologies, Inc., Durham, NC (US)

( * ) Notice: Subject to any disclaimer, the term of this patent is extended or adjusted under 35 U.S.C. 154(b) by 158 days.

(21) Appl. No.: 15/716,265

(22) Filed: Sep. 26, 2017

(65) Prior Publication Data
US 2018/0041203 A1 Feb. 8, 2018

Related U.S. Application Data

(63) Continuation of application No. 15/190,095, filed on Jun. 22, 2016, now Pat. No. 9,774,322.

(51) Int. Cl.
| | | |
|---|---|---|
| *H03B 1/00* | (2006.01) | |
| *H03K 3/00* | (2006.01) | |
| *H03K 17/22* | (2006.01) | |
| *H03K 7/08* | (2006.01) | |
| *H03K 5/19* | (2006.01) | |
| *H02M 3/07* | (2006.01) | |
| *H03K 17/06* | (2006.01) | |
| *H02M 1/08* | (2006.01) | |
| *H02M 3/158* | (2006.01) | |

(52) U.S. Cl.
CPC ............ *H03K 17/223* (2013.01); *H02M 3/07* (2013.01); *H03K 5/19* (2013.01); *H03K 7/08* (2013.01); *H03K 17/063* (2013.01); *H02M 1/08* (2013.01); *H02M 3/158* (2013.01); *H03K 2017/066* (2013.01)

(58) Field of Classification Search
CPC .......... H03K 17/223; H03K 5/19; H02M 3/07
USPC ........................................................ 327/109
See application file for complete search history.

(56) References Cited

U.S. PATENT DOCUMENTS

| | | |
|---|---|---|
| 4,636,825 A | 1/1987 | Baynes |
| 5,091,817 A | 2/1992 | Alley et al. |
| 5,227,781 A | 7/1993 | Ninnis |
| 5,258,638 A | 11/1993 | Elhatem et al. |
| 5,289,040 A | 2/1994 | Rogers |
| 5,298,851 A | 3/1994 | DeNardis |
| 5,495,165 A | 2/1996 | Beland |
| 5,714,809 A | 2/1998 | Clemo |
| 5,721,144 A | 2/1998 | Hsieh et al. |

(Continued)

*Primary Examiner* — Metasebia T Retebo
(74) *Attorney, Agent, or Firm* — Carr & Ferrell LLP

(57) ABSTRACT

The present disclosure presents a circuit, a method, and a system to drive a half-bridge switch using depletion (D) mode compound semiconductor (III-V) switching transistors for a DC-DC converter using at least one driver to drive the switches of the circuit. Also included is at least one charge pump electrically connected to a gate of the transistor, to maintain a voltage that holds the transistor in an off-state. The circuit includes AC coupling capacitors to level shift a voltage and realize fast transistor switching.

19 Claims, 5 Drawing Sheets

(56) References Cited

U.S. PATENT DOCUMENTS

| Patent/Publication | Kind | Date | Inventor |
|---|---|---|---|
| 5,786,685 | A | 7/1998 | Lange et al. |
| 5,789,791 | A | 8/1998 | Bergemont |
| 5,801,091 | A | 9/1998 | Efland et al. |
| 5,815,356 | A | 9/1998 | Rodriguez et al. |
| 5,955,763 | A | 9/1999 | Lin |
| 6,292,046 | B1 | 9/2001 | Ali |
| 6,424,006 | B1 | 7/2002 | Ponse |
| 6,900,482 | B2 | 5/2005 | Aoki et al. |
| 7,132,717 | B2 | 11/2006 | Su et al. |
| 7,157,959 | B2 | 1/2007 | Ball et al. |
| 7,251,178 | B2 | 7/2007 | Gogl et al. |
| 7,313,006 | B2 | 12/2007 | Choi |
| 7,560,346 | B2 | 7/2009 | Igarashi |
| 7,952,117 | B2 | 5/2011 | Masuda |
| 8,008,960 | B2 | 8/2011 | Arduini |
| 8,064,179 | B2 | 11/2011 | Apfel |
| 8,097,906 | B2 | 1/2012 | Takagi |
| 8,203,372 | B2 | 6/2012 | Arduini |
| 8,274,121 | B2 | 9/2012 | Vorhaus |
| 8,339,055 | B2 | 12/2012 | Zhan et al. |
| 8,344,463 | B2 | 1/2013 | Yanagihara et al. |
| 8,344,464 | B2 | 1/2013 | Cho |
| 8,426,952 | B2 | 4/2013 | Cho et al. |
| 8,497,574 | B2 | 7/2013 | Cho et al. |
| 8,513,707 | B2 | 8/2013 | Herberholz |
| 8,519,916 | B2 | 8/2013 | Vorhaus |
| 8,541,271 | B1 | 9/2013 | Vorhaus |
| 8,569,811 | B1 | 10/2013 | Vorhaus et al. |
| 8,575,621 | B1 | 11/2013 | Vorhaus |
| 8,637,909 | B1 | 1/2014 | Vorhaus |
| 8,653,565 | B1 | 2/2014 | Vorhaus |
| 8,759,924 | B1 | 6/2014 | Vorhaus |
| 8,835,239 | B1 | 9/2014 | Vorhaus |
| 8,896,034 | B1 | 11/2014 | Vorhaus |
| 8,952,424 | B2 | 2/2015 | Herberholz |
| 9,006,799 | B2 | 4/2015 | Vorhaus |
| 9,136,265 | B2 | 9/2015 | Vorhaus |
| 9,236,378 | B2 | 1/2016 | Vorhaus |
| 9,252,143 | B2 | 2/2016 | Vorhaus |
| 9,536,871 | B2 | 1/2017 | Vorhaus |
| 9,774,322 | B1 | 9/2017 | Duduman et al. |
| 2002/0014670 | A1 | 2/2002 | Litwin |
| 2002/0142554 | A1 | 10/2002 | Nakajima |
| 2004/0164407 | A1 | 8/2004 | Nakajima et al. |
| 2006/0198173 | A1* | 9/2006 | Rozman .................. H02M 1/08 363/123 |
| 2007/0200803 | A1 | 8/2007 | Kimura |
| 2007/0228424 | A1 | 10/2007 | Igarashi |
| 2007/0236424 | A1 | 10/2007 | Kimura |
| 2007/0296028 | A1 | 12/2007 | Brar et al. |
| 2008/0111611 | A1* | 5/2008 | Thiele .............. H03K 17/04123 327/427 |
| 2009/0050900 | A1 | 2/2009 | Masuda |
| 2009/0065810 | A1 | 3/2009 | Honea et al. |
| 2009/0095989 | A1 | 4/2009 | Kim |
| 2010/0171685 | A1 | 7/2010 | Kimura |
| 2011/0187283 | A1 | 8/2011 | Wang et al. |
| 2012/0032606 | A1 | 2/2012 | Fukumoto et al. |
| 2012/0037917 | A1 | 2/2012 | Vorhaus |
| 2012/0086497 | A1 | 4/2012 | Vorhaus |
| 2012/0099357 | A1 | 4/2012 | Morita |
| 2012/0267795 | A1 | 10/2012 | Shimura |
| 2013/0043487 | A1 | 2/2013 | Liu et al. |
| 2014/0191305 | A1 | 7/2014 | Vorhaus |
| 2015/0054091 | A1 | 2/2015 | Vorhaus |
| 2015/0171080 | A1 | 6/2015 | Vorhaus |
| 2015/0357323 | A1 | 12/2015 | Vorhaus |
| 2016/0036330 | A1 | 2/2016 | Sturcken et al. |
| 2016/0086937 | A1 | 3/2016 | Vorhaus |
| 2016/0118894 | A1* | 4/2016 | Zhang .................... H02M 1/08 323/271 |
| 2017/0093282 | A1* | 3/2017 | Moghe .................. H02M 3/158 |

\* cited by examiner

GATE DRIVER FOR DEPLETION-MODE TRANSISTORS

CROSS-REFERENCE TO RELATED APPLICATIONS

This Non-Provisional Patent Application is a continuation of, and claims priority benefit of, U.S. patent application Ser. No. 15/190,095, filed Jun. 22, 2016, entitled "Gate Driver for Depletion-Mode Transistors." The aforementioned disclosure is hereby incorporated by reference herein in its entirety including all references cited therein.

FIELD OF THE INVENTION

The present invention relates to semiconductor devices, and more specifically to gate driver circuits for depletion-mode Field Effect Transistors (FETs).

BACKGROUND

A DC-DC converter circuit is a type of switching circuit that regulates an output voltage from a given input voltage. The circuit may step-up (e.g. Boost converter) or step-down (e.g. Buck converter) the voltage. Switching circuits come in two varieties, standard and synchronous. FIG. 1A illustrates a prior art standard Buck DC-DC converter circuit 100. Standard Buck converters use a control switching transistor 102 to regulate voltage and current flow in the upper side, while a diode 104 is used for the lower side of the circuit. A periodic signal, such as a Pulse Width Modulated (PWM) signal exhibiting a duty cycle (D), allows control and regulation of the output voltage by exercising the control switch in accordance with the duty cycle of the PWM signal. The duty cycle represents the fraction of a switching period during which the control switching transistor 102 is turned on. The output voltage (VOUT) 120 is directly proportional to the product of the input voltage (VIN) 108 and the duty cycle (D). A driver 116 alternately switches the upper-side transistor 102 on and off in step with the PWM signal, thereby regulating the time-averaged voltage at the switching node 106. A forward biased diode 104, facilitates the continuous flow of inductor current when the control transistor 102 is switched off. The diode 104 is customarily referred to as a "freewheeling diode", since it circulates positive output inductor 110 current flow (flowing toward VOUT 120) while the control switching transistor 102 is in an off state. The combination of the transistor 102 and diode 104, in response to the PWM signal, operate to regulate the voltage level VOUT 120 across the load, $R_L$ 114. A voltage source provides input voltage at VIN 108. The switching node 106 between the control switch 102 and the freewheeling diode 104 is connected to the converter's output through a low-pass filter comprising an inductor 110 and an output capacitor 112. VOUT 120 is referenced to ground 118.

FIG. 1B illustrates a prior art synchronous DC-DC converter circuit 122. This type of converter circuit 122 uses a half-bridge switch configuration, and therefore has two switching transistors, which are known as the upper-side (or control) transistor 102 and the lower-side (or synchronous) transistor 124. The two transistors are actively controlled to alternately switch on and off out of phase with each other, regulating the output voltage VOUT 120. A voltage source provides input voltage at VIN 108. The switching node 106 between the two devices is connected to the converter's output through a low-pass filter comprising an output inductor 110 and an output capacitor 112. VOUT 120 is referenced to ground 118. A driver 116 provides on/off control for the switching transistors 102 and 124, in response to a periodic control signal such as a PWM signal.

The transistor switches can be fabricated as either enhancement-mode (E-mode) devices, which are off-state at zero applied gate bias, or depletion-mode (D-mode) devices, which are on-state at zero applied gate bias.

Silicon (Si) based voltage converters typically use enhancement mode MOSFETs for the transistor switches 102, and 124, and for drivers. A Gallium-Arsenide (GaAs) depletion mode power FET transistor is also a 3-terminal device. There is a channel running between drain (D) and source (S), whose conduction is controlled by the gate (G) potential. The gate-to-source (or gate-to-drain) junction V-I characteristics resemble very much that of a diode junction, ranging from a Schottky to a high-threshold P-N diode. A N-channel depletion mode FET has a negative threshold for D-S conduction and is on when no voltage is applied to the gate, turning off when a bias more negative than its threshold is applied G-S. As the G-S bias increases above the threshold voltage, the D-S channel resistance decreases in proportion to the increase in bias differential. G-S bias is ultimately limited in the positive domain by the forward biasing of the G-S junction.

Compound semiconductors, such as GaAs III-V materials, offer high frequency transistor switching capabilities, however, their G-S control junctions (some resembling Schottky junctions) can be leakier than doped P-N silicon counterparts. Engineering the control circuits to manage the junction leakage issue in the absence of existing negative bias supplies, is substantially more difficult. Also, synchronous converter circuits built using all D-mode switching transistors may conduct current in an uncontrolled and potentially wasteful and/or damaging fashion upon system start-up, before the control electronics can apply nominal voltages to the transistor gate electrodes.

The need for additional circuit components, design complexity and the normally inexistent negative bias supplies in typical applications has deterred prior commercialization of D-mode gate drivers.

SUMMARY

In various embodiments a driver circuit is described that includes at least one gate drive circuit to control a depletion mode switching transistor. Also included is at least one charge pump electrically connected to a gate of the transistor, to maintain a voltage that holds the transistor in an off-state. At least one coupling capacitor is electrically connected between the output of each of the gate drive circuits and a gate of the transistor, to shift a gate voltage that alternately drives the transistor into an on-state and an off-state.

Also included is a method for driving a depletion-mode transistor in a DC-DC converter. The method steps include initializing a signal to begin a startup condition, switching a power isolating switch to an on-state, and initiating at least one command to control a driver circuit to pass an external controller-generated PWM control signal to a gate of the switching transistor. The control signal alternately drives the switching transistor to an on-state and an off-state.

A system for converting DC voltages is presented that includes a driver circuit comprising a first gate drive circuit and a second gate drive circuit, an upper circuit comprising a depletion mode transistor, and a lower circuit comprising a second depletion mode transistor. Also included is at least one gate controller, at least one coupling capacitor connected between the output of the first driver circuit and the gate of the first transistor for level shifting gate drive circuit voltages, at least one coupling capacitor connected between the output of the second driver circuit and gate of the second transistor, and a low-pass filter connected in series with a resistive load. The system operates by using the controller to alternately switch the upper and lower circuits to an on-state in response to a predetermined voltage level, wherein at least a portion of the system is integrated on a common substrate.

BRIEF DESCRIPTION OF THE DRAWINGS

Certain embodiments of the present technology are illustrated by the accompanying figures. It will be understood that the figures are not necessarily to scale and that details not necessary for an understanding of the technology or that render other details difficult to perceive may be omitted. It will be understood that the technology is not necessarily limited to the particular embodiments illustrated herein.

DETAILED DESCRIPTION

Figure 1A:
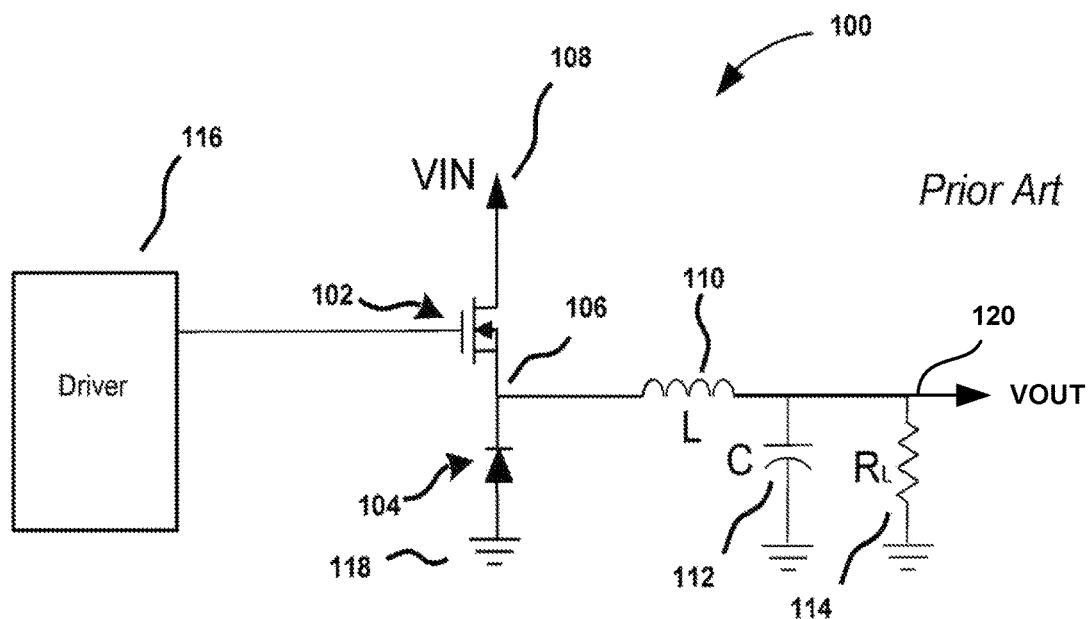
FIG. 1A illustrates an exemplary standard DC-DC converter power stage and output filter circuit.
Figure 1B:
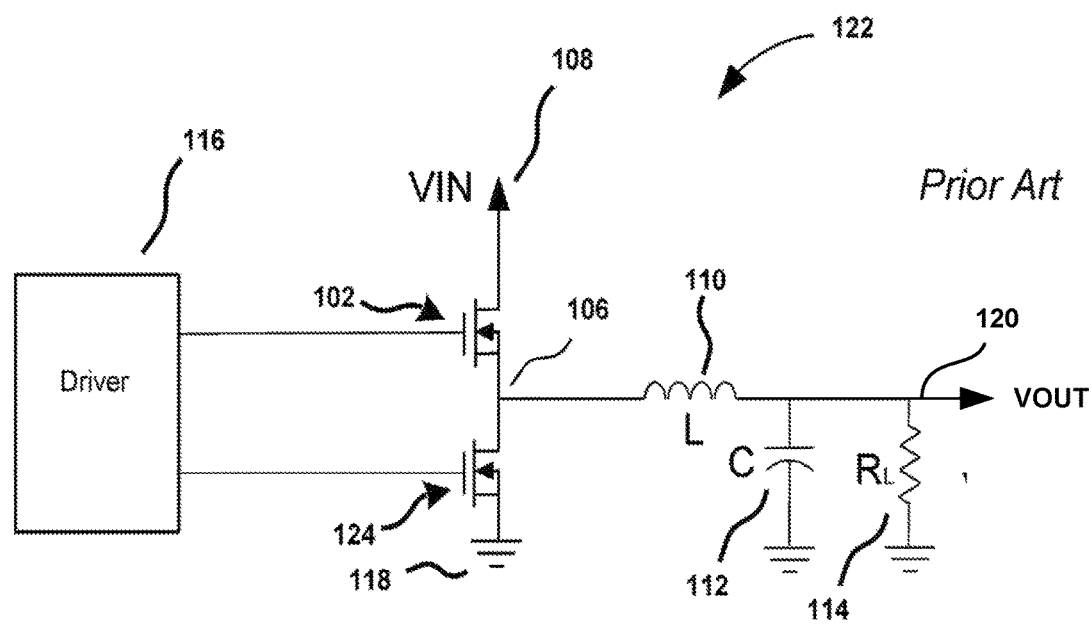
FIG. 1B illustrates an exemplary synchronous DC-DC converter power stage and output filter circuit.

While the disclosed technology is available for embodiment in many different forms, there is shown in the drawings and will herein be described in detail several specific embodiments with the understanding that the present disclosure is to be considered as an exemplification of the principles of the technology and is not intended to limit the technology to the embodiments illustrated.

The terminology used herein is for the purpose of describing particular embodiments only and is not intended to be limiting of the present technology. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used in this specification, the terms "include," "including," "for example," "exemplary," "e.g.," and variations thereof, are not intended to be terms of limitation, but rather are intended to be followed by the words "without limitation" or by words with a similar meaning. Definitions in this specification, and all headers, titles and subtitles, are intended to be descriptive and illustrative with the goal of facilitating comprehension, but are not intended to be limiting with respect to the scope of the inventions as recited in the claims. Each such definition is intended to also capture additional equivalent items, technologies or terms that would be known or would become known to a person having ordinary skill in this art as equivalent or otherwise interchangeable with the respective item, technology or term so defined. Unless otherwise required by the context, the verb "may" indicates a possibility that the respective action, step or implementation may be performed or achieved, but is not intended to establish a requirement that such action, step or implementation must be performed or must occur, or that the respective action, step or implementation must be performed or achieved in the exact manner described.

It will be understood that like or analogous elements and/or components, referred to herein, may be identified throughout the drawings with like reference characters. It will be further understood that several of the figures are merely schematic representations of the present technology. As such, some of the components may have been distorted from their actual scale for pictorial clarity.

Figure 2:
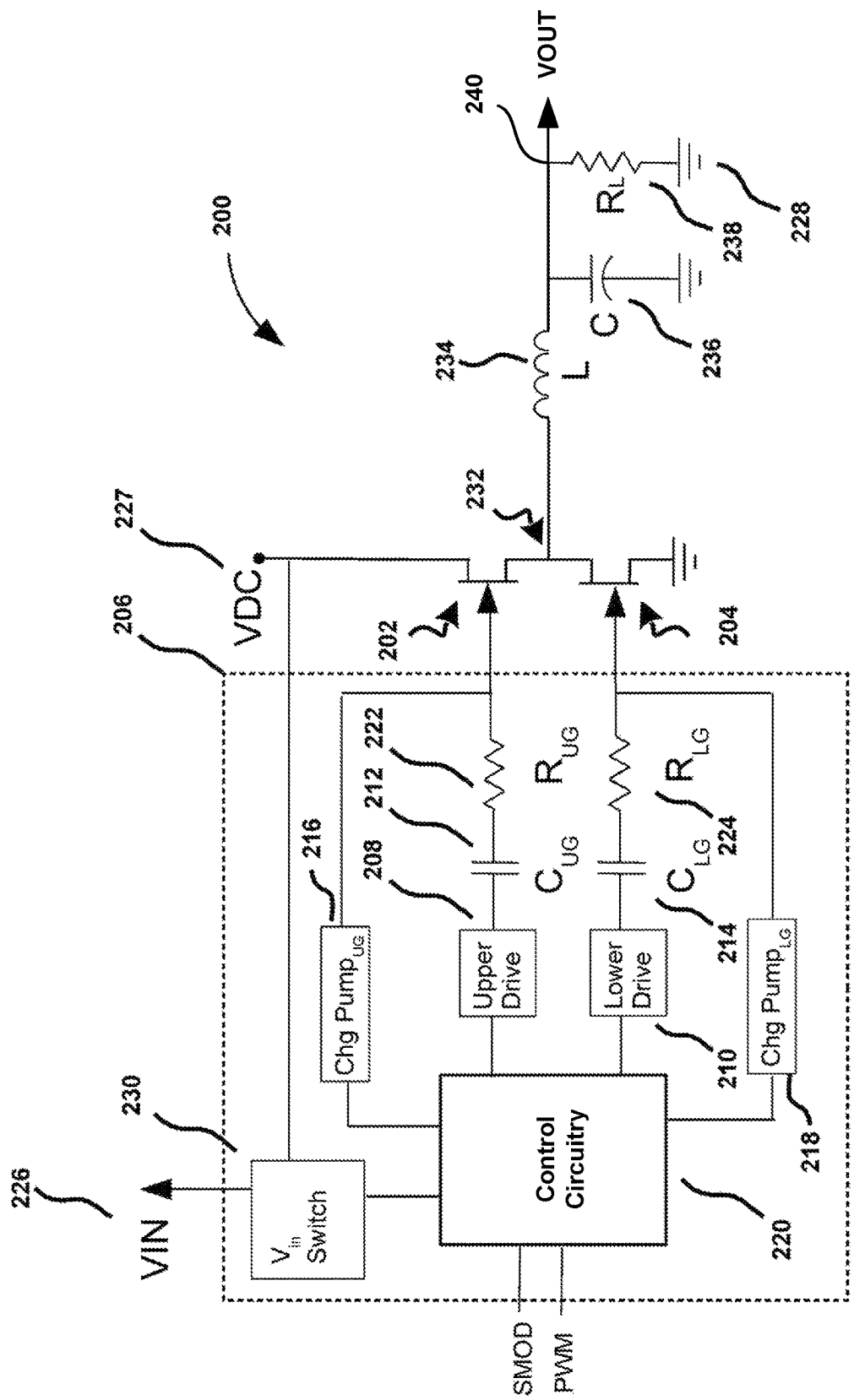
FIG. 2 illustrates a DC-DC converter power stage and output filter circuit comprising D-mode switching transistors in accordance with aspects of the technology.

FIG. 2 shows an embodiment of a single phase voltage converter power stage circuit 200. The converter power stage 200 includes a driver for driving PWM signal through a FET module assembly, comprising high-side and low-side transistor switches in a half-bridge synchronous configuration. Either E-mode or D-mode transistors may be implemented using N-channel or P-channel devices. The exemplary embodiments presented herein describe N-channel D-mode FETs. Various embodiments of FIG. 2 use multiple monolithically integrated GaAs compound semiconductor (III-V) D-mode FETs for the switches in a synchronous DC converter. A gFet™ module (see U.S. Pat. No. 8,896,034 B1) is an example of a monolithically integrated GaAs switching circuit.

In various embodiments, a single phase converter 200 includes a pair of FET switches identified as the upper (control) switch 202, and a lower (synch) switch 204, a driver 206, and a low-pass filter. The low-pass filter includes an inductor (L) 234 and a capacitor (C) 236, connected between the switching node 232 and ground 228 of the circuit. The driver 206 includes an upper gate drive circuit 208 and a lower gate drive circuit 210 connected to control circuitry 220. Also included is an upper gate coupling capacitor ($C_{uG}$) 212 connected between the output of the upper drive 208 and the gate of the upper transistor 202. A lower coupling capacitor ($C_{LG}$) 214 is connected between the output of the lower drive 210 and the gate of the lower transistor 204. The capacitors, $C_{uG}$ and $C_{LG}$, are used to level shift the driver outputs from the positive domain into a mostly negative voltage domain, necessary to control the D-mode switches. An upper gate charge pump (Chg Pump$_{UG}$) 216, and a lower gate charge pump (Chg Pump$_{LG}$) 218 are connected to the gates of the upper transistor 202 and lower transistor 204, respectively. The charge pumps 216 and 218 are designed to maintain a negative charge on the transistor gates to keep the transistors in an extended off-state when so needed. In some embodiments, the charge pump 216 and 218 may be fully integrated with the gate driver 206. An input voltage switch (VIN Switch) 230 connected between VIN 226 and the upper transistor 202 is also provided to keep current from flowing through the upper transistor prior to the charge pumps 216 and 218 being fully charged. In some embodiments, optional upper ($R_{UG}$) and lower ($R_{LG}$) gate resistors 222 and 224 are connected between $C_{UG}$ 212 and $C_{LG}$ 214 and gates of their respective transistor 202 and 204.

In various embodiments, N-channel D-mode FETs require negative voltage to switch between an on-state and an off-state. In those embodiments, $C_{UG}$ 212 and $C_{LG}$ 214 function to voltage shift the gate drive voltage into the negative domain relative to a transistor gate to source threshold voltage ($V_{gs\_th}$) using AC coupling in lieu of a negative rail.

In some embodiments, all of the driver components may be integrated on a common substrate or various discrete components may be integrated in a package. In various embodiments, the upper and lower gate drive circuits 208 and 210 include at least a portion of the control circuitry 220.

The driver 206 functions to provide switching control of the upper and lower switching transistors 202 and 204 by modulating transistor input power and gate signals. At startup, and prior to receiving PWM signals from a PWM controller, VIN may not be present, and $C_{UG}$ 212 and $C_{LG}$ 214, and charge pumps 216 and 218 may be discharged. Both $C_{UG}$ 212 and $C_{LG}$ 214, and negative charge pumps 216 and 218 must become charged to hold the FETs 202 and 204 in the off-state. The VIN Switch 230 is held off to prevent current from flowing through the upper transistor when VIN 226 is initially supplied because conduction by upper FET 202 or both FETs 202 and 204 simultaneously may overcharge the output and/or overload the circuit. The upper gate drive circuit 208 and lower gate drive circuit 210, controlled by the gate drive controller 220, each drive their respective transistor gates to control the on or off states of the transistor, thereby controlling the output at the switching node 232. In various embodiments, at startup, and with the VIN Switch 230 open, the driver control circuitry 220 issues a series of internally generated (not received from the external PWM controller) PWM signals to "exercise" (i.e. send control signals to them) the gates of the upper and lower transistors 202 and 204. Exercising the transistor gates enables quick charging of capacitors $C_{UG}$ 212 and $C_{LG}$ 214, shortening the time necessary to develop the negative charge required to turn the D-mode switches off, in preparation for closing the input switch and enabling normal operation by means of externally generated PWM signals. Switching the D-mode switches off using charge pumps alone may result in intolerable delay in enabling the circuit for normal operation. Alternatively, the charge pumps may be sized significantly larger, however doing so may be uneconomical. Charging $C_{UG}$ 212 and $C_{LG}$ 214 by this method prepares the circuit to switch the transistors 202 and 204 on and off by voltage level shifting incoming PWM signals and also allows for turning on the VIN switch. When the charge pumps 216 and 218 are enabled, they work to maintain the negative charge across capacitors $C_{UG}$ 212 and $C_{LG}$ 214 and keep transistors 202 and 204 in an off-state until controlling PWM control signals are received. Keeping the transistors 202 and 204 off renders the circuit available for receiving externally generated PWM signals. The AC coupling capacitors $C_{UG}$ 212 and $C_{LG}$ 214 operate to level shift the drive circuit's Pulse Width Modulation (PWM) outputs to a range of voltages that comply with the corresponding FET switch's gate to source threshold voltage ($V_{gs\_th}$), directing the transistor into an off-state or on-state. Resistors $R_{UG}$ 222 and $R_{LG}$ 224 may optionally be placed between the $C_{UG}$ 212 and $C_{LG}$ 214, and the corresponding gate input of the transistors 202, and 204, to reduce the occurrence of circuit oscillations. These oscillations may occur due to high series parasitic inductance, for example. For example, a typical N-channel D-mode transistor may have a switching threshold of −0.8 Volts. Voltages below the threshold voltage keep the transistor switched off, and voltages above the threshold allow current flow through the transistor. A voltage rail that supplies zero to five (5) volts, for example, is incapable of turning off the transistor, while a properly selected AC coupling capacitor may shift the normally 0 to 5 volt gate-to-source voltage ($V_{GS}$) of a PWM control signal to a −4.5 V to 0.5 Volt range. This shifted voltage range corresponds with voltages above and below the switching threshold ($V_{gs\_th}$). A voltage VIN 226 is present, and after transistors 202 and 204 are both driven into an off-state, VIN Switch 230 is closed applying voltage to power the upper transistor 202. Of note is that VIN Switch 230 disconnects VIN 226 from the D-mode switches when it cannot be ensured that the gate drive controller 220 can keep the power switches off or when a fault occurs in a circuit component such that normal operation must be suspended. The charge pumps 216 and 218 continue to maintain the voltage more negative than the threshold, $V_{gs\_th}$, after the VIN Switch 230 is closed to keep transistors 202 and 204 in the off-state. For example, the charge pumps 216 and 218 maintain a voltage more negative than (lower than) $V_{gs\_th}$ when paired with N-channel D-mode transistors 202 and 204. Thereafter, the charge pumps 216 and 218 may be disabled and incoming PWM control signals may be permitted to modulate the voltage output from the transistor pair 202 and 204 by alternately switching the transistors 202 and 204 on and off according to the duty cycle imposed on the PWM signal. Operation with a normal, periodic PWM input recharges the coupling capacitors 212 and 214, maintaining proper operational negative bias. An output received at the switching node 232 may be low-pass filtered through inductor (L) 234, and a capacitor (C) 236 to produce an output voltage (VOUT) 240 exhibiting minimal ripple across a load, $R_{load}$ 238.

The following equation approximates a minimum value for determining a capacitance value for a coupling capacitor (AC drive capacitor, e.g. coupling capacitor 212 and/or 214) used for voltage shifting a gate drive output.

$$C_{ac\_drive} = \frac{Q_{g\_FET}}{V_{drive} - R_{out\_driver} \cdot Q_{g\_FET} \cdot 1/d \cdot F_{SW} \cdot 10^{-3} - V_f + V_{off}}$$

Where:

$C_{ac\_drive}$ is a series AC drive capacitor value in nano-Farads (nF)

$Q_{g\_FET}$ is a total gate charge of a FET power transistor being driven, as measured by sweeping a gate-source voltage from $V_f$ to $V_{off}$ in a circuit of interest, in nano-Coulombs (nC)

$V_{drive}$ is a magnitude of the gate drive output voltage excursion in Volts (V)

$R_{out\_drive}$ is the gate drive's output impedance in Ohms (Ω)

d is the duty cycle of the FET power transistor being driven, expressed as a number between 0 and 1

$F_{sw}$ is a switching frequency of the power transistor in megahertz (MHz)

$V_f$ is a forward gate-source junction voltage of the power transistor in the ON state, in Volts (this is a positive number)

$V_{off}$ is a desired reverse bias gate-source junction voltage of the power transistor in the OFF state, in Volts (this is a negative number)

The equation shown above may not account for the gate leakage that D-mode transistors may exhibit in the OFF state. In addition, the $R_{out\_drive}$ term in the denominator may be merely an approximation. Increased accuracy may be obtained with an equation that considers additional parameters. A value that is a few times larger than the minimum necessary value may provide sufficient margin for tolerances and variety in operating conditions.

Figure 3:
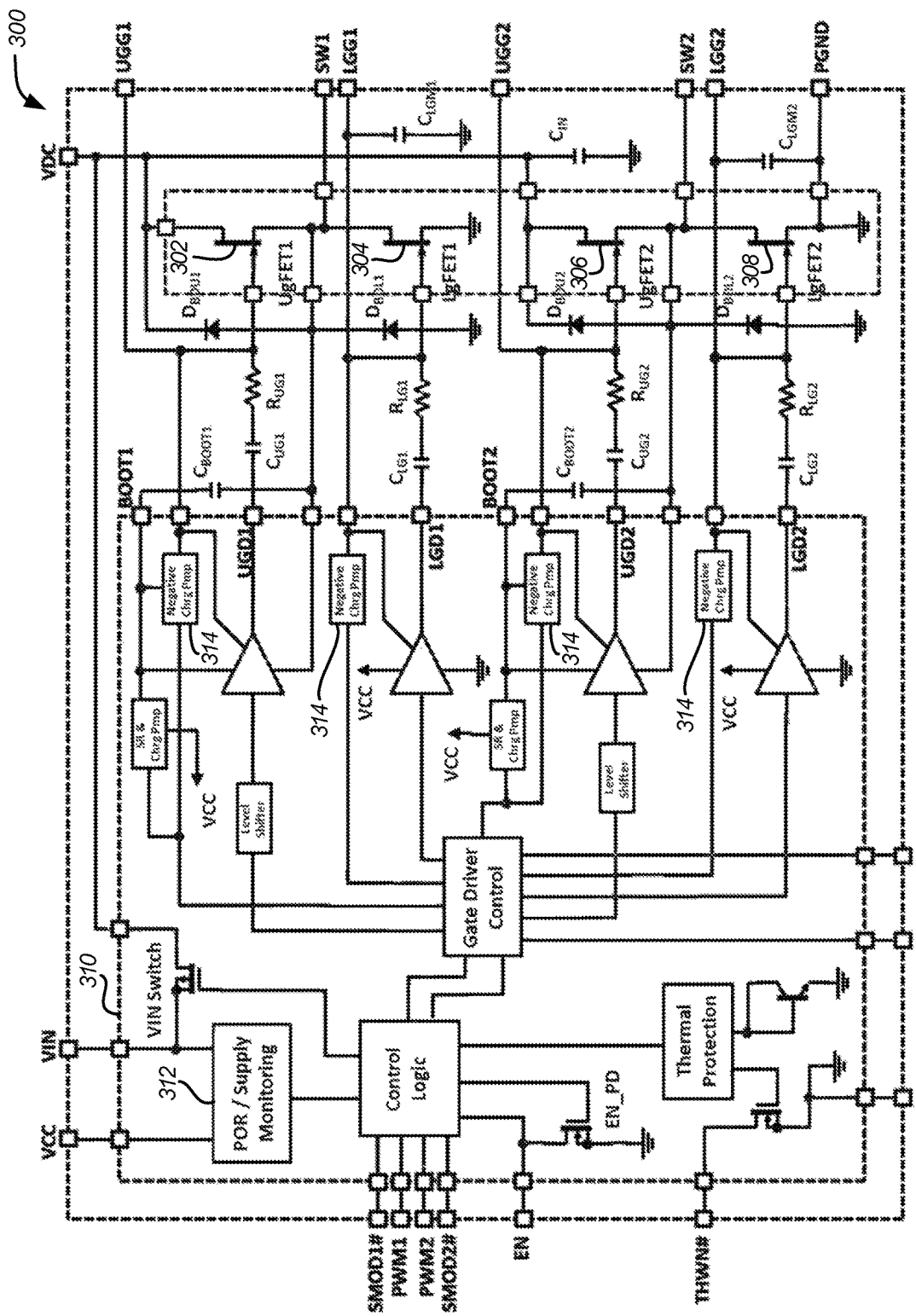
FIG. 3 illustrates a dual phase DC-DC converter power stage circuit comprising D-mode switching transistors in accordance with aspects of the technology.

FIG. 3 is a circuit schematic that illustrates an example of a Dual Phase Power Stage circuit 300 for application with D-mode FETs. The dual phase power stage circuit 300 includes a first FET pair comprising upper UgFET1 302 and lower LgFET1 304. The dual phase power stage circuit 300 includes a second FET pair comprising upper UgFET2 306 and lower LgFET2 308. A dual phase driver 310 controls the output of gate signals to the gates of the FET transistors, UgFET1 302, LgFET1 304, UgFET2 306, and LgFET2 308. The dual phase driver 310 outputs may be level shifted using coupling capacitors CUG1, CLG1, CUG2, and CLG2 before being applied to the gates of the respective transistors UgFET1 302, LgFET1 304, UgFET2 306, and LgFET2 308. An output from the FET1 pair (UgFET1 302, LgFET1 304) is applied at terminal SW1. An output from the FET2 pair (UgFET2 306, LgFET2 308) is applied at terminal SW2. The outputs at SW1 and SW2 may be connected to low-pass filters with the voltage applied across one or more resistive loads. Negative Charge Pumps 314 are included to maintain the D-mode FETs off during tri-state, when the FET half-bridge switch circuit (e.g. upper FET1, lower FET1) is not switching and the VIN switch is closed or prior to its closure. The Dual Phase Power Stage circuit 300 includes additional components such as input power supplies monitors and thermal protection circuitry, as described below.

In some embodiments, prior to startup, VCC and VIN may not initially be present, and the coupling capacitors CUG1, CLG1, CUG2, and CLG2 may be discharged. The coupling capacitors $C_{UGx}$ and $C_{LGx}$ become charged when the gates of the switching transistors UgFET1 302, LgFET1 304, UgFET2 306, LgFET2 308 are exercised by the internally generated PWM pulses and the negative charge pumps 314 are enabled to hold the SW nodes in tristate, where both the upper and lower FETs are held in the off-state. When operational, the negative charge pumps 314 may not develop the same negative voltage amplitude across the coupling capacitors CUG1, CLG1, CUG2, and CLG2 as the negative voltage amplitude created by the passing of PWM pulses through the switching transistors UgFET1 302, LgFET1 304, UgFET2 306, LgFET2 308, but it is understood that the amplitude of the voltage developed is sufficiently negative to keep the switching transistors in an off state.

Figure 4A:
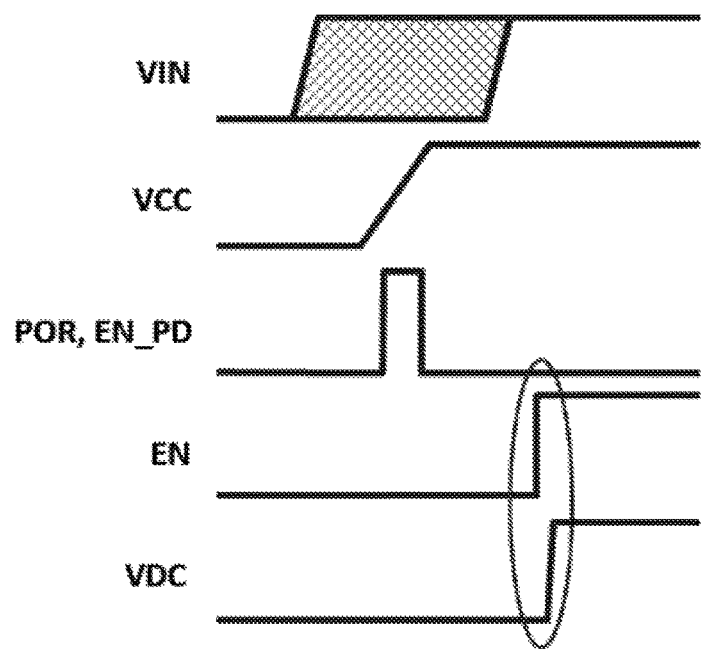
FIG. 4A is an exemplary timing diagram that illustrates a start-up sequence in accordance with aspects of the technology.
Figure 4B:
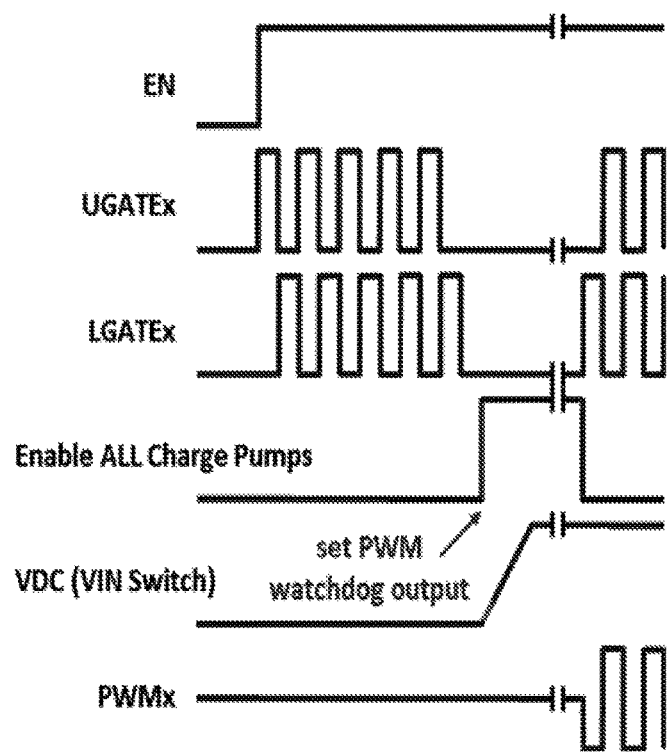
FIG. 4B is an exemplary timing diagram that illustrates finer details of start-up sequence 4A in accordance with aspects of the technology.

FIGS. 4A is an exemplary timing diagram that illustrates a start-up sequence in accordance with aspects of the technology. FIG. 4B is an exemplary timing diagram that illustrates additional details of the start-up sequence of FIG. 4A, in accordance with aspects of the technology. The timing diagram illustrated in FIG. 4A shows a start-up sequence for the converter power stage displayed in FIG. 3 after initiating voltage at the bias supply voltage, VCC, and the power supply voltage, VIN. Once the power supply monitor circuit 312 senses that VCC and VIN thresholds have been exceeded, and power-on-resets are released, the control circuitry waits for an EN high signal from one or multiple external components. In the case of multiple EN signals, they are typically logically tied together. Power-on-reset is a signal that is generated by specially designed circuitry as the bias supply comes up into operational range, and is a signal that is used to reset all logic gates to a known, predictable state. Power-on-reset function is well understood by those skilled in the art.

Referring to FIG. 4A and FIG. 4B, the EN signal, circled in FIG. 4A triggers internal control logic to generate a series of 'dummy' PWM cycles, which propagate to the UGATEx and LGATEx outputs in the timing diagram shown in FIG. 4B, where 'x' corresponds to a number of the target FET pair (e.g., UgFET1 302, LgFET1 304, UgFET2 306, LgFET2 308). These cycles are referred to as "dummy" cycles because they are internally generated (not received from the external PWM controller) and they are used to quickly charge up the coupling capacitors (e.g., CUG1, CLG1, CUG2, CLG2) and are not intended to regulate an output voltage. The 'dummy' cycles exercise the FET gates, causing charging of the coupling capacitors CUG1, CLG1, CUG2, CLG 2 which then allow the switching transistors to be held off and the input switch to be turned on. A number of 'dummy' PWM cycles that may be propagated may vary with the design of the converter components. In various embodiments, the cycle count is 1, 2, 4, 10, 20, 50, or more cycles. A typical count may be 16 cycles. Once these cycles have completed, FIG. 4B illustrates the negative charge pumps 314 being enabled to maintain the D-mode FETs in an off-state (tristate) until the VIN switch is turned on and externally generated PWM signals are permitted to control switch operation. See FIG. 4B timing diagram as an illustration of the start-up sequence. The described components and their operation embody a dual path gate drive; an AC-coupled path for high speed switching, and a second DC path for maintaining off-state gate bias.

A timer may be used to allow sufficient delay for the input switch, VIN Switch, to turn on. The VIN switch's turn-on is controlled, occurring gradually to avoid high inrush currents from developing, as indicated by the slope in the wave pattern associated with the VDC 227 (VIN switch output). When the VIN switch timer expires, the control circuitry allows externally generated voltage control signals, PWMx, to propagate through the Control Logic to the Gate Driver Control circuit. PWM signals are propagated to the upper and lower gate drives to control the on or off states of the FETs of the half bridge switch configuration, thereby regulating the converter output.

In various embodiments, while receiving PWM signals to control the half-bridge circuit, a watchdog timer may detect an absence of PWM signals for a predetermined period. Since the operation under PWM signals recharges the gate capacitors, and since the gates of the FETs leak charge commensurate to the voltages applied to their terminals, the depletion of these capacitors (CUG1, CLG1, CUG2, CLG2) may allow the D-mode devices to inadvertently switch to an unintended state. For example, a D-mode n-channel FET may inadvertently turn-on when the capacitor charge is depleted.

Figure 5:
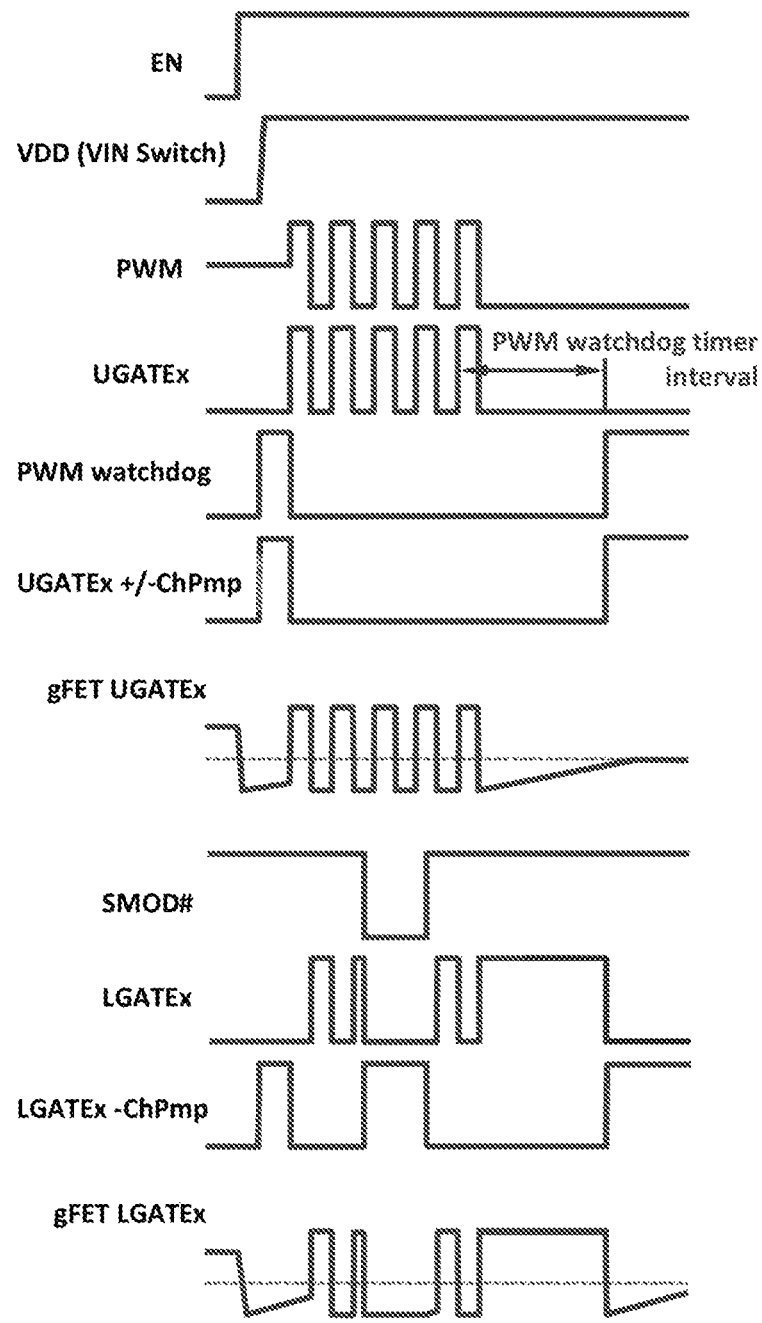
FIG. 5 is an exemplary timing diagram that illustrates PWM and SMOD signal processing in accordance with aspects of the technology.

FIG. 5 is an example timing diagram that illustrates the response of the circuit of FIG. 3 to changes in PWM and SMOD input signals. The driver outputs follow the PWM input signal, where a PWM high turns on the upper FET switch and a PWM low turns on the lower FET switch. A tri-stated PWM keeps both upper and lower transistor switches off.

As shown in FIG. 5, activity of the watchdog timer in response to the absence of a low-to-high PWM transition over a pre-determined time interval causes the PWM watchdog signal to go high, and the control circuitry to enable the upper negative charge pumps. Somewhat similarly, SMOD# assertion, asynchronous to PWM operation, turns off the lower power switch driver and enables the respective phase's lower negative charge pump (when there is one SMOD# input per phase).

some embodiments, the gate driver circuit shown in FIG. 3 may be integrated on the same semiconductor substrate with the FET transistors of the half-bridge circuit when compatible materials and fabrication processes are used. For example, a GaAs-based driver or a smaller sub-section of it may be integrated with GaAs-based upper/lower transistors (e.g., UgFET1 302, LgFET1 304, UgFET2 306, LgFET2 308) on the same substrate. In other situations where materials and fabrication techniques are inadequate for full integration, package level integration may suffice. In some embodiments a hybrid integrated circuit (HIC) may be formed, wherein a portion of the components are integrated on a single substrate, and the remaining portion of components are integrated at the package level (e.g. on a common substrate). For example, integrating a Si FET driver matched with GaAs-based Upper/Lower FETs may be accomplished at the package level.

In some embodiments, an asynchronous converter may be emulated using the gate drive controller to control the state of the lower transistor (e.g., LgFET1 304, LgFET2 308) in response to a skip mode input signal, SMOD. In these embodiments, activating SMOD turns off the lower gate drive output, keeping the lower device off while SMOD is active. Any positive inductor current passes through a lower integrated freewheeling Schottky diode. The circuit layout of FIG. 3 illustrates freewheeling Schottky diodes $D_{BDL1}$ and $D_{BDL2}$. This may be different from true zero-crossing diode emulation, which is a mode of low-current operation. In order to keep the lower devices (e.g., LgFET1 304, LgFET2 308) off for extended periods of time, the lower drivers' negative charge pumps are made active while SMOD is asserted.

FIG. 3 also illustrates two pairs of half-bridge converters (i.e., UgFET1 302 paired with LgFET1 304, and UgFET2 306 paired with LgFET2 308) that can be applied to two separate output voltage domains. Various other embodiments may include additional pairs of half-bridge converter circuits that can be used to add additional phases. The additional half-bridge circuits may be embodied separately or integrated.

The above description is illustrative and not restrictive. This patent describes in detail various embodiments and implementations of the present invention and the present invention is open to additional embodiments and implementations, further modifications, and alternative constructions. There is no intention in this patent to limit the invention to the particular embodiments and implementations disclosed; on the contrary, this patent is intended to cover all modifications, equivalents and alternative embodiments and implementations that fall within the scope of the claims. Moreover, embodiments illustrated in the figures may be used in various combinations. Any limitations of the invention should, therefore, be determined not with reference to the above description, but instead should be determined with reference to the appended claims along with their full scope of equivalents.

What is claimed is:

1. A system comprising:
   a depletion or low-threshold enhancement mode compound semiconductor (III-V) switching transistor;
   a charge pump to maintain a voltage that holds the transistor in an off-state;
   a coupling capacitor electrically coupled to a gate of the transistor, the coupling capacitor configured to receive pulse width modulated (PWM) signals and shift a gate voltage that alternately drives the transistor into an on-state and the off-state; and
   a gate control circuit electrically coupled to the transistor and configured to:
   receive external PWM signals during operation,
   generate internal PWM signals during startup before receiving external PWM signals,
   output received and generated PWM signals to the coupling capacitor to shift the gate voltage and alternately drive the transistor into the on-state and the off-state, and
   output control signals to the charge pump, the control signals configured to hold the transistor in the off state.

2. The system of claim 1, wherein the gate control circuit comprises control logic and a gate drive circuit.

3. The system of claim 1, further comprising an input power isolating switch to isolate an input voltage from the depletion mode switching transistor during generation of the PWM signals.

4. The system of claim 1, wherein a gate voltage below a negative threshold voltage drives the transistor to an off-state.

5. The system of claim 4, wherein the charge pump supplies a voltage to the gate of the depletion mode transistor gate voltage below a negative threshold voltage when the input power isolating switch is in an on-state, to maintain the depletion mode transistor in an off-state.

6. The system of claim 5, wherein the charge pump supplies a voltage to the gate of the depletion mode transistor below a negative threshold voltage when the input power isolating switch is in an on-state, to maintain the depletion mode transistor in an off-state.

7. The system of claim 1, wherein the charge pump is integrated in the same die with the one gate drive.

8. The system of claim 1, wherein the coupling capacitor provides an AC-coupled gate drive circuit for high-speed switching, and the charge pump provides a negative DC voltage for maintaining off-state bias.

9. The system of claim 1, further comprising a watchdog protocol to monitor the occurrence and timing of recharge signals for recharging the coupling capacitor.

10. The system of claim 1, further comprising a bidirectional enable (EN) signal for coordinating start-up and shut-down operations with a PWM controller and any optionally connected parallel power stage.

11. A method for driving a depletion-mode transistor in a dc-dc converter, the method comprising:
   initializing a signal to initiate a startup condition;
   switching a power isolating switch to an on-state;
   initiating a command to control a gate control circuit to propagate an external PWM signal and couple the externally generated PWM signal to a coupling capacitor connected to a gate of the transistor to alternately drive the transistor to an on-state and an off-state; and
   enabling a charge pump to hold the gate in an off state.

12. The method of claim 11, wherein the startup condition comprises:
   while the power isolating switch is in an open-state:
      receiving an enable signal for triggering a series of dummy PWM cycles, in response to the enable signal, generating a predetermined sequence of PWM cycles internally to the gate control circuit; and
      outputting the internally generated series of PWM cycles to a coupling capacitor to charge the coupling capacitor to a voltage below a negative threshold voltage for driving the transistor to an off-state;
   after completion of the predetermined series of PWM cycles:
      enabling the power isolating switch to switch to a closed state, and enabling a charge pump to maintain a voltage below the negative threshold voltage necessary to hold the transistor in the off-state.

13. The method of claim 11, further comprising voltage level shifting a gate voltage for driving the transistor alternately to an on-state and an off-state using a one coupling capacitor.

14. The method of claim 11, further comprising voltage level shifting a gate voltage for driving the transistor to an off-state using a charge pump.

15. A system for converting DC voltages comprising:
   an upper circuit comprising an upper depletion mode compound semiconductor (III-V) transistor;
   a lower circuit comprising a lower depletion mode compound semiconductor (III-V) transistor;
   a gate controller circuit including logic and buffers to receive, condition, and electrically couple PWM signals to the upper circuit and the lower circuit, the gate controller configured to alternately switch the upper and lower circuits to an on-state in response to the PMW signals;
   an upper coupling capacitor connected between an output of an upper buffer of the gate control circuit and a gate of the upper depletion mode compound semiconductor (III-V) transistor for level shifting the upper buffer voltage coupled to the upper circuit;
   a lower coupling capacitor connected between an output of a lower buffer of the gate control circuit and a gate of the lower depletion mode compound semiconductor (III-V) transistor for level shifting the lower buffer voltage coupled to the lower circuit; and
   a watchdog circuit including a timer configured to detect an absence of PWM signal transition for a predetermined period and logic to enable a charge pump to hold the gate of the upper transistor in a low state.

16. The system of claim 15, wherein the gate control logic is further configured to enable the charge pump to hold the gate of the lower transistor in a low state for extended periods of time in response to assertion of a skip mode signal.

17. The system of claim 15, further comprising a bidirectional enable (EN) signal for coordinating start-up and shut-down operations with a PWM controller and any optionally connected parallel power stage.

18. The system of claim 15, further comprising a thermal protection circuit and a voltage protection circuit for operation with hybrid electronic devices.

19. The system of claim 15, wherein a portion of the system comprises a hybrid integrated circuit (HIC).

* * * * *